US008772630B2

(12) United States Patent
Lee et al.

(10) Patent No.: US 8,772,630 B2
(45) Date of Patent: Jul. 8, 2014

(54) SOLAR CELL AND METHOD OF MANUFACTURING THE SAME

(75) Inventors: Kyoungsoo Lee, Seoul (KR); Manhyo Ha, Seoul (KR); Jonghwan Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 666 days.

(21) Appl. No.: 12/588,167

(22) Filed: Oct. 6, 2009

(65) Prior Publication Data

US 2011/0000536 A1    Jan. 6, 2011

(30) Foreign Application Priority Data

Jul. 6, 2009 (KR) .................. 10-2009-0061232

(51) Int. Cl.
*H01L 31/0236* (2006.01)
*H01L 31/0368* (2006.01)
*H01L 31/0376* (2006.01)
*H01L 31/18* (2006.01)
*H01L 31/0224* (2006.01)
*H01L 31/20* (2006.01)
*H01L 31/068* (2012.01)
*H01L 31/0216* (2014.01)

(52) U.S. Cl.
CPC ........ *H01L 31/0236* (2013.01); *H01L 31/1804* (2013.01); *Y02E 10/546* (2013.01); *H01L 31/022425* (2013.01); *H01L 31/202* (2013.01); *H01L 31/068* (2013.01); *H01L 31/03762* (2013.01); *Y02E 10/52* (2013.01); *Y02E 10/545* (2013.01); *Y02E 10/548* (2013.01); *H01L 31/03685* (2013.01); *Y02E 10/547* (2013.01); *H01L 31/02168* (2013.01); *H01L 31/03682* (2013.01); *H01L 31/1872* (2013.01)
USPC ........................................... 136/256; 136/261

(58) Field of Classification Search
None
See application file for complete search history.

(56) References Cited

U.S. PATENT DOCUMENTS

| 2003/0178057 | A1* | 9/2003 | Fujii et al. ...................... 136/256 |
| 2007/0062575 | A1* | 3/2007 | Inomata ........................ 136/256 |
| 2009/0211626 | A1* | 8/2009 | Akimoto ....................... 136/252 |

FOREIGN PATENT DOCUMENTS

| JP | 2002-076398 | 3/2002 |
| JP | 2003-133568 | 5/2003 |
| KR | 10-2008-0105280 | 12/2008 |

* cited by examiner

*Primary Examiner* — Jennifer Michener
*Assistant Examiner* — Christopher Danicic
(74) *Attorney, Agent, or Firm* — McKenna Long & Aldridge LLP

(57) ABSTRACT

The present invention relates to solar cells. Such solar cells include a substrate containing a first impurity of a first conductive type and having a textured surface with a plurality of jagged portions. Such solar cells also have an emitter layer positioned on the textured surface and containing a second impurity of a second conductive type opposite to the first conductive type, a first electrode having a plurality of first metal particles, electrically connected to the emitter layer, and a second electrode electrically connected to the substrate. The diameter of the first metal particles is larger than the peak-to-peak distance between adjacent jagged portions.

12 Claims, 5 Drawing Sheets

SOLAR CELL AND METHOD OF MANUFACTURING THE SAME

This application claims priority to and the benefit of Korean Patent Application No. 10-2009-0061232 filed in the Korean Intellectual Property Office on Jul. 6, 2009, the entire contents of which are incorporated herein by reference.

BACKGROUND OF THE INVENTION (a) Field of the Invention

Embodiments relate to a solar cell and a method of manufacturing the same.

(b) Description of the Related Art

Recently, as existing energy sources such as petroleum and coal are expected to be depleted, interests in alternative energy sources for replacing the existing energy sources are increasing. Among the alternative energy sources, solar cells have been particularly spotlighted because, as cells for generating electric energy from solar energy, the solar cells are able to draw energy from an abundant source and do not cause environmental pollution.

A general solar cell includes a substrate and an emitter layer, formed of a semiconductor, each having a different conductive type such as a p-type and an n-type, and electrodes respectively formed on the substrate and the emitter layer. The general solar cell also includes a p-n junction formed at an interface between the substrate and the emitter layer.

When light is incident on the solar cell, a plurality of electron-hole pairs are generated in the semiconductor. Each of the electron-hole pairs is separated into electrons and holes by the photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires, to thereby obtain electric power.

SUMMARY OF THE INVENTION

According to an aspect of the present invention, a solar cell includes a substrate containing impurities of a first conductive type, the substrate having a textured surface including a plurality of jagged portions. The solar cell also includes an emitter layer covering the textured surface, the emitter layer containing impurities of a second conductive type, wherein the conductivity of the second type is opposite the conductivity of the first conductive type, and wherein the emitter layer has a textured surface, over the textured surface of the substrate, including a plurality of jagged portions that generally align with the jagged portions associated with the substrate. Further, the solar cell includes a first electrode comprising glass frit and a plurality of first metal particles, the first electrode electrically connected to the emitter layer. Still further, the solar cell includes a second electrode electrically connected to the substrate, wherein the diameter of each of the plurality of first metal particles is greater than the distance between adjacent jagged portions of the emitter layer.

According to another aspect of the present invention, a method of manufacturing a solar involves forming a textured surface on a substrate containing an impurity of a first conductive type, the textured surface having a plurality of jagged portions, and forming an emitter layer over the substrate by injecting an impurity of a second conductive type, such that the emitter layer has a textured surface comprising a plurality of jagged portions, wherein each of the jagged portions of the emitter layer generally align with a corresponding jagged portion of the substrate, and wherein the conductivity of the impurity of the second conductive type is opposite to the conductivity of the impurity of the first conductive type. The method also involves applying a first paste containing a plurality of first metal particles on the textured surface of the emitter layer forming a second electrode pattern by applying a second paste containing a plurality of second metal particles and performing a thermal process on the substrate thereby forming a first electrode from the first and second electrode patterns, wherein the first electrode is electrically connected to the emitter layer, and forming a second electrode electrically connected to the substrate, wherein the diameter of each of the plurality of first metal particles is greater than the distance between adjacent jagged portions associated with the emitter layer.

BRIEF DESCRIPTION OF THE DRAWINGS

Exemplary embodiments of the present invention will be described in detail with reference to the accompanying drawings for a clear understanding of the advantages of the present invention, wherein.

DETAILED DESCRIPTION OF THE EMBODIMENTS

Figure 1:
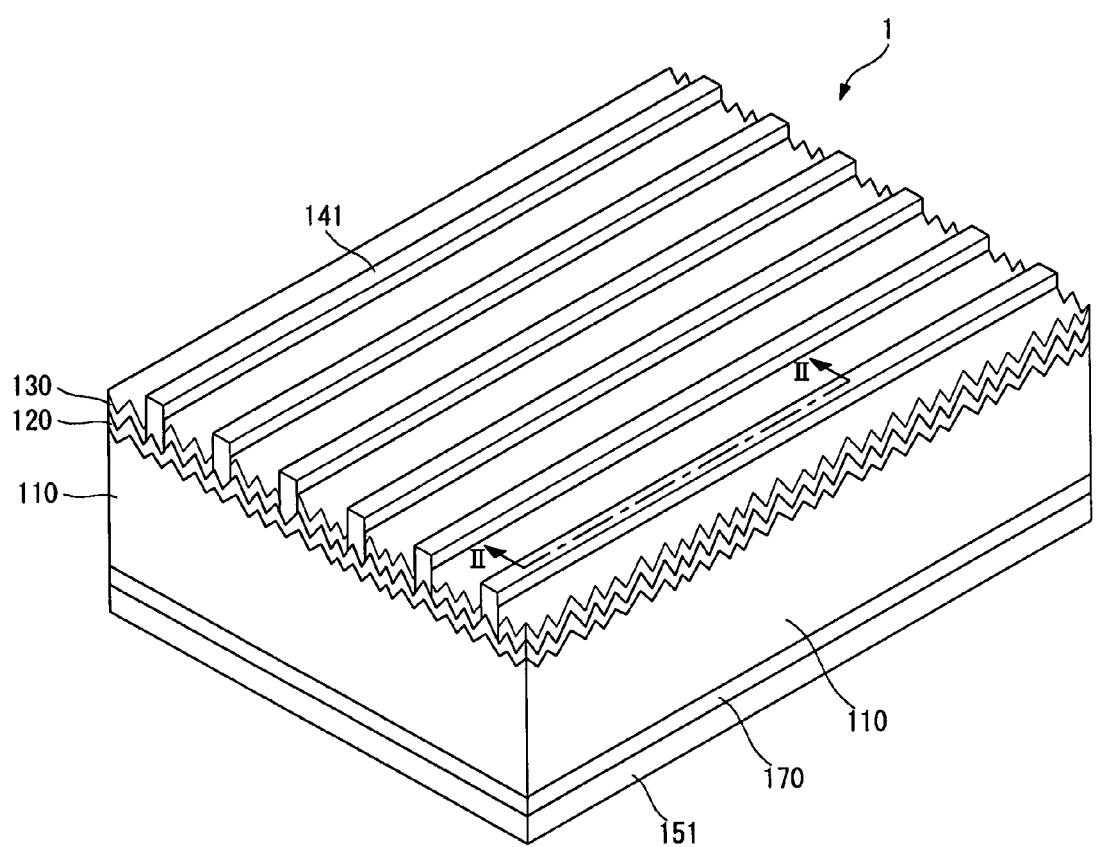
FIG. 1 is a partial perspective view of a solar cell according to an exemplary embodiment of the present invention.

The present invention will be described more fully hereinafter with reference to the accompanying drawings, in which exemplary embodiments of the present invention are shown. This invention may, however, be embodied in many different forms and should not be construed as limited to the embodiments set forth herein.

In the drawings, the thickness of layers, films, panels, regions, and the like, are exaggerated for clarity. Furthermore, like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
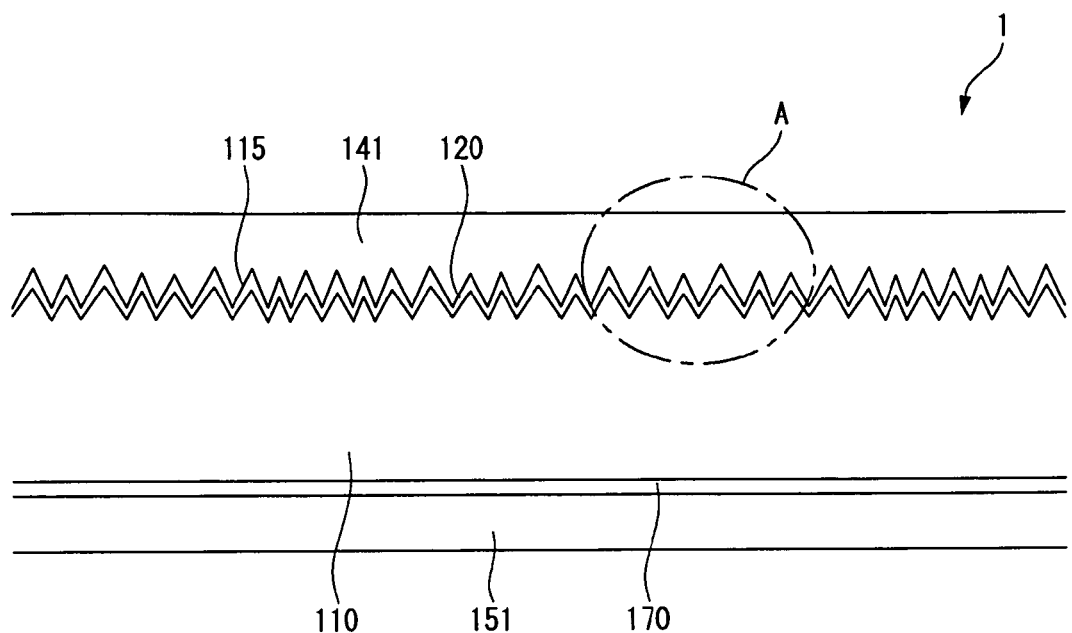
FIG. 2 is a cross-sectional view taken along the line II-II of FIG. 1.
Figure 3:
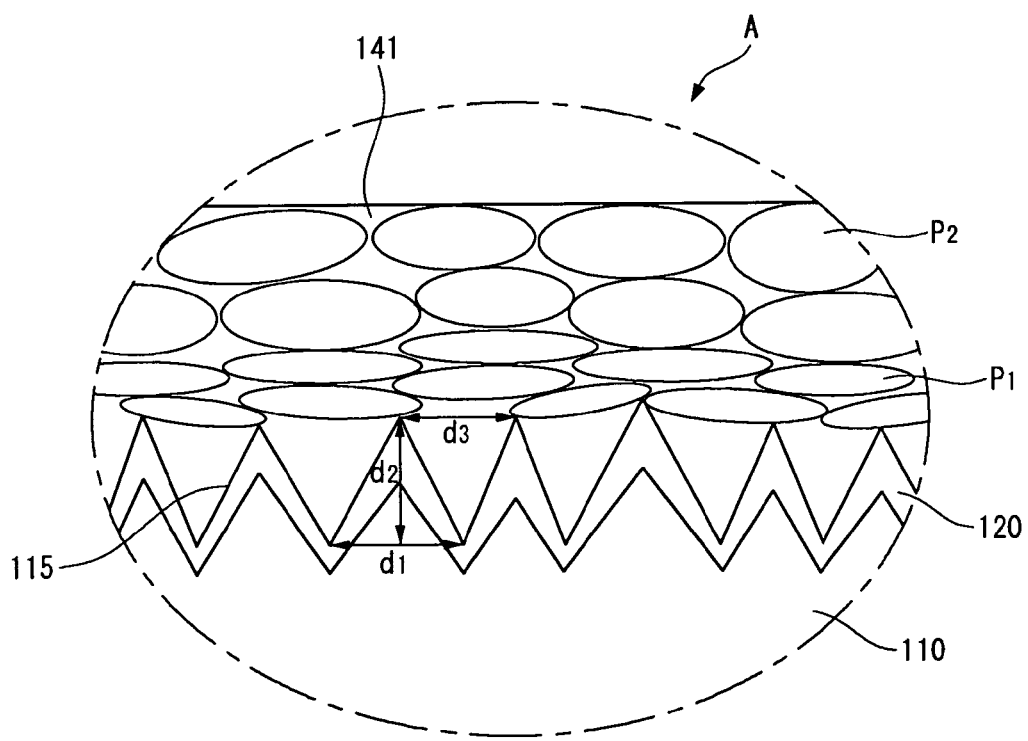
FIG. 3 is an enlarged view of portion "A" of FIG. 2.

A solar cell according to an exemplary embodiment of the present invention will now be described with reference to FIGS. 1 to 3. FIG. 1 is a partial perspective view of a solar cell according to an exemplary embodiment of the present invention. FIG. 2 is a cross-sectional view taken along line II-II of FIG. 1. FIG. 3 is an enlarged view of portion "A" of FIG. 2.

Referring to FIG. 1, a solar cell 1 according to exemplary embodiments includes a substrate 110, an emitter layer 120 positioned on an incident surface (hereinafter, referred to as "a front surface") of the substrate 110, on which light is incident. The solar cell 1 also includes an anti-reflection layer 130 positioned on the emitter layer 120, a plurality of front electrodes 141 electrically connected to the emitter layer 120, a rear electrode 151 positioned on a rear surface of the substrate 110 opposite to the front surface of the substrate 110, and a back surface field (BSF) 170 positioned between the substrate 110 and the rear electrode 151.

In accordance with exemplary embodiments, substrate 110 may be formed of silicon doped with an impurity of a first conductive type, for example, a p-type impurity. Examples of silicon include single crystal silicon, polycrystalline silicon, and amorphous silicon. When the substrate 110 is of a p-type, the substrate 110 contains a group III element impurity, such as boron (B), gallium (Ga), or Indium (In). Alternatively, substrate 110 may be of an n-type, and/or be made of materials other than silicon. When substrate 110 is of an n-type, substrate 110 may contain a group V element impurity, such as phosphor (P), arsenic (As), or antimony (Sb).

The surface of substrate 110 is textured in that it has an uneven surface. Though somewhat exaggerated in FIG. 1 for purposes of illustration, the textured surface includes a plurality of jagged portions 115 as shown.

As stated, FIG. 3 is an enlarged view of section "A" of FIG. 2. As shown in FIG. 3, and in particular the textured surface, the diameter (i.e., the maximum diameter) d1, which reflects the distance across the base of each jagged portion 115 is about 300 nm to 800 nm. The height d2 of each jagged portion 115 is about 300 nm to 800 nm. In addition, the distance d3 which reflects the peak-to-peak distance between adjacent jagged portions 115 is about 200 nm to 500 nm.

The emitter layer 120 contains an impurity of a second conductive type (for example, an n-type impurity) which has a conductivity that is opposite to the conductivity of the first conductive type of substrate 110. The emitter layer 120 and the substrate 110 come together to form a p-n junction. The emitter layer 120 is formed by diffusing an impurity into substrate 110. The emitter layer 120, accordingly, has a textured surface that substantially mimics the textured surface of the substrate 110 as shown.

A plurality of electron-hole pairs produced by light incident on the substrate 110 are separated into electrons and holes by a built-in potential difference resulting from the p-n junction. The separated electrons then move toward the n-type semiconductor, and the separated holes move toward the p-type semiconductor. Thus, when the substrate 110 is the p-type and the emitter layer 120 is the n-type, the separated holes move to the substrate 110 and the separated electrons move to the emitter layer 120. Accordingly, the holes in the substrate 110 and the electrons in the emitter layer 120 become major carriers.

In accordance with exemplary embodiments, the emitter layer 120 has a sheet resistance of about 80 Ω/sq. to 150 Ω/sq., which is greater than that of conventional emitter layers according to the prior art. Thus, the thickness, that is, an impurity doped thickness of emitter layer 120 formed in the substrate 110 is less than that of conventional emitter layers according to the prior art. Thus, the impurity concentration of the doped emitter layer 120 is less than conventional emitter layers according to the prior art. Further, as shown in FIGS. 2 and 3, the thickness of the emitter layer 120 varies. For example, in the proximity of the peak of each jagged portion 115 the thickness and the impurity concentration of the doped emitter layer 120 is greatest.

In conventional prior art emitter layers, the sheet resistance is typically about 50 Ω/sq. Moreover, the thickness of the emitter layer is about 300 nm to 400 nm, whereas the thickness of emitter layer 120 is about 250 nm to 350 nm.

It should be noted that the emitter layer 120 may be of the p-type, while the substrate 110 is of the n-type. This is different from the embodiment described above. In this case, the separated electrons would move to the substrate 110 and the separated holes to the emitter layer 120.

Returning to the embodiment in which the emitter layer 120 is of the n-type, the emitter layer 120 may be formed by doping the substrate 110 with a group V element impurity such as P, As, or Sb. To the contrary, when the emitter layer 120 is of the p-type, the emitter layer 120 may be formed by doping the substrate 110 with a group III element impurity such as B, Ga, or In.

The anti-reflection layer 130 is then formed on the emitter layer 120. The anti-reflection layer 130 can be made of silicon nitride SiNx or silicon oxide SiOx, etc. The anti-reflection layer 130 reduces light reflectance incident on the substrate 110 and increases the selectivity of light that falls within a predetermined wavelength band, thus increasing the efficiency of the solar cell 1. The anti-reflection layer 130 may be omitted, if desired.

The plurality of front electrodes 141 are positioned on the emitter layer 120 and are electrically connected to the emitter layer 120. The plurality of front electrodes 141 are spaced apart from each other and extend in a predetermined direction. The front electrodes 141 collect charges (for example, electrons) that move to the emitter layer 120.

The front electrodes 141 contain a conductive material such as silver (Ag). However, instead of silver (Ag), the front electrodes 141 may contain at least one of another material selected from the group consisting of nickel (Ni), copper (Cu), aluminum (Al), tin (Sn), zinc (Zn), indium (In), titanium (Ti), and gold (Au), or a combination thereof. Still, other conductive materials may be used.

In this exemplary embodiment, the front electrodes 141 include a plurality of recrystallized Ag particles P1 and a plurality of Ag particles P2. The plurality of recrystallized Ag particles P1 are formed by reaction with silicon Si contained in the emitter layer 120 and the plurality of Ag particles P2. The plurality of Ag particles P2 are contained in a paste for forming the front electrodes 141. At this time, the plurality of recrystallized Ag particles P1 mainly exist near interface region between the emitter layer 120 and the front electrodes 141. Each of the plurality of recrystallized Ag particles P1 have a diameter of about 300 nm to 700 nm, and each of the plurality of Ag particles P2 has a diameter of about 2 μm to 5 μm.

Because the diameter of each recrystallized Ag particle P1 is greater than the distance (about 200 nm to about 500 nm) between adjacent jagged portions 115, the plurality of recrystallized Ag particles P1 are mainly positioned on or above the apex or peak of the jagged portions 115 of emitter layer 120, near the interface of the emitter layer 120 and the front electrodes 141, as shown in FIG. 3. Accordingly, the front electrodes 141 substantially connect electrically with the apex or peaks of the jagged portions 115 of the emitter layer 120.

Because the thickness and the impurity doped concentration of the emitter layer 120 is less than conventional, prior art emitter layers, the mobility of the charges transferred to the front electrodes 141 through the emitter layer 120 is improved and the recombination of charges occurring near the surface of the emitter layer 120 is decreased. Accordingly, the charge transfer rate toward the front electrodes 141 is increased.

The rear electrode 151 is substantially formed on the entire rear surface of the substrate 110. The rear electrode 151 includes a conductive material such as aluminum (Al) and is electrically connected to the substrate 110. The rear electrode 151 collects charges (for example, holes) that move to the substrate 110 and the outputs the charge to an external device. The rear electrode 151 may contain at least one conductive material selected from the group consisting of nickel (Ni), copper (Cu), silver (Ag), tin (Sn), zinc (Zn), indium (In), titanium (Ti), and gold (Au), or a combination thereof. However, other conductive materials may be used.

The BSF 170 is positioned between the rear electrode 151 and the substrate 110. The BSF 170 is an area (for example, a p+-type area) that is more heavily doped with an impurity of the same conductive type as the substrate 110 than the substrate 110.

A potential barrier is formed due to a difference of impurity doped concentrations between the substrate 110 and the BSF 170. The movement of the electrons to the rear surface of the substrate 110 is disturbed by the potential barrier. Accordingly, the BSF 170 prevents or at least reduces the recombination and/or the disappearance of the electrons and holes near the rear surface of the substrate 110.

The operation of the solar cell 1 having the above-described structure, according to the exemplary embodiments of the present invention will now be described. When light irradiates the solar cell 1 incident on the substrate 110 through the anti-reflection layer 130 and the emitter layer 120, a plurality of electron-hole pairs are generated in the substrate 110 by light energy. Reflection loss of light incident on the front surface of the substrate 110 is reduced due to the textured surface and the anti-reflection layer 130. Thus the amount of light incident on the substrate 110 is increased.

The electron-hole pairs are separated by the p-n junction of the substrate 110 and the emitter layer 120. The separated electrons move to the n-type emitter layer 120 and the separated holes move to the p-type substrate 110. The electrons that move to the n-type emitter layer 120 are collected by the front electrodes 141. The holes that move to the p-type substrate 110 are collected by the rear electrode 151. When the front electrodes 141 are connected to the rear electrode 151 by electric wires (not shown), current flows therethrough, which can, in turn, be used for electric power.

Because the sheet resistance of the emitter layer 120 is greater compared to conventional prior art emitter layers, whereby the thickness and the impurity doped concentration of the emitter layer 120 is less, the mobility of the charges, for example, electrons, passing through the emitter layer 120 is improved. The transfer rate of the charges, therefore, moving toward the front electrodes 141 is greater, and the recombination of charges in the emitter layer 120 is less. Accordingly, the efficiency of the solar cell 1 is improved.

Referring now to FIGS. 4A to 4E, a method of manufacturing the solar cell 1 according to exemplary embodiments of the preset invention will be described. More specifically, FIGS. 4A to 4E are cross-sectional views showing sequential steps of a method of manufacturing the solar cell 1.

Figure 4A:
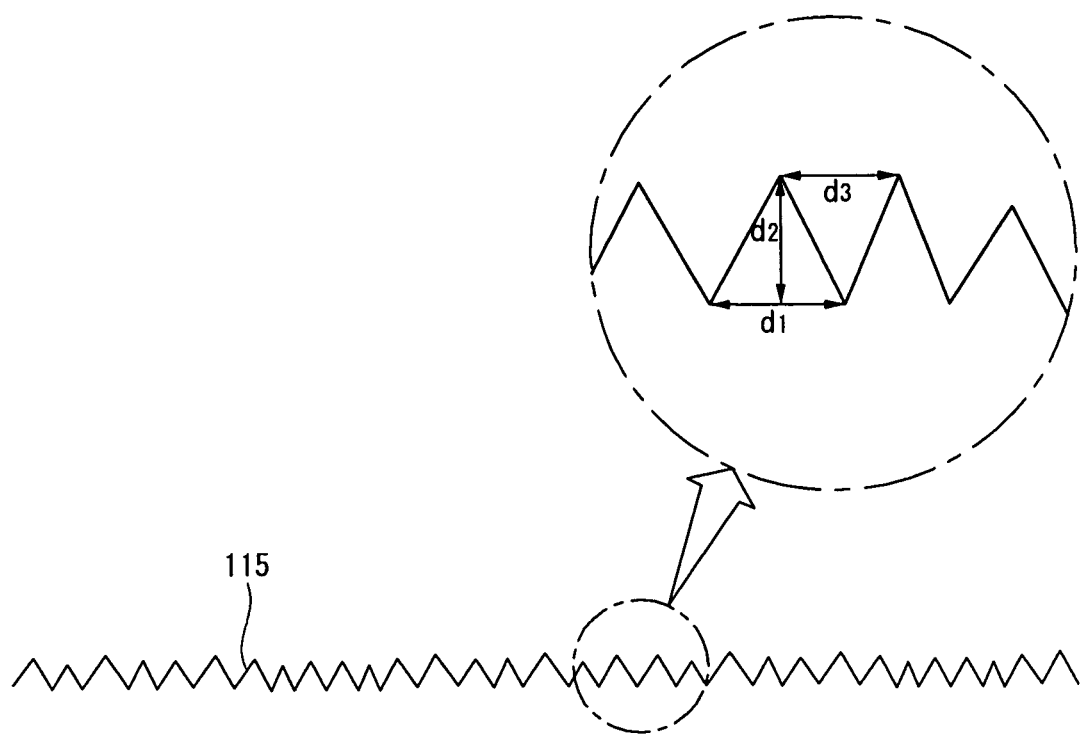
FIGS. 4A to 4E are cross-sectional views sequentially showing certain steps in a method of manufacturing a solar cell according to exemplarys embodiment of the present invention.
Figure 4A:

First, as shown in FIG. 4A, an exposed surface, for example, a front (incident) surface of substrate 110 is etched using dry etching, such as reaction ion etching (RIE), to form a textured surface having a plurality of jagged portions 115. Alternatively, wet etching may be used. The substrate 110 is made of p-type single crystal silicon, but may alternatively be made of n-type polycrystalline silicon or amorphous silicon.

The jagged portions 115 formed by dry (or wet) etching have a cone shape. Additionally, the jagged portions 115 have a diameter d1 and a height d2 of about 300 nm to 800 nm. Moreover, a peak-to-peak distance d3 between adjacent jagged portions 115 is about 200 nm to 500 nm. Herein, diameter d1 means the maximum diameter associated with the jagged portions 115.

Figure 4B:
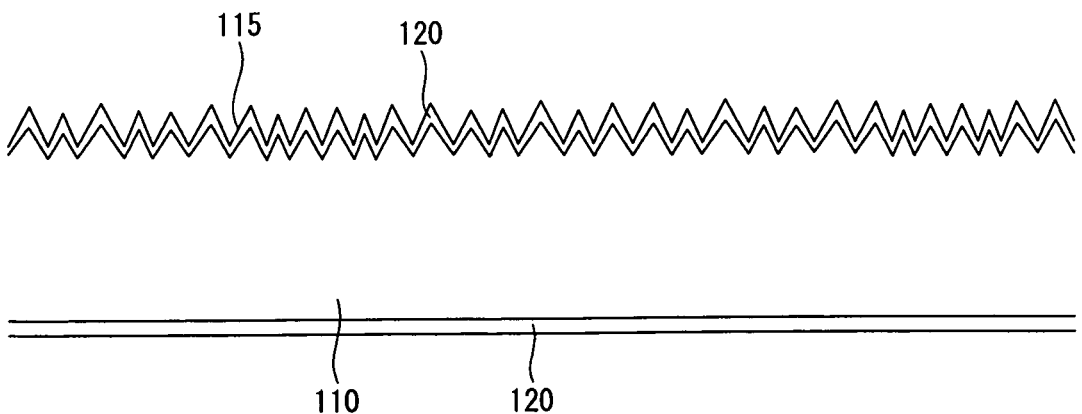
Figure 4C:
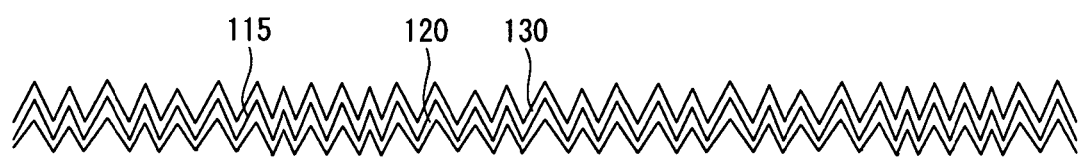

Next, as shown in FIG. 4B, a high temperature thermal process involving a material (for example, $POCl_3$ or $H_3PO_4$) containing a group V element impurity such as P, As, or Sb is performed on substrate 110 in order to diffuse the group V element impurity on the substrate 110, thus forming emitter layer 120 which contains an impurity. The emitter layer 120 is formed on the surface of the substrate 110 including a front surface, a rear surface, and a side surface. If, instead, the substrate 110 is made of n-type material, a high temperature thermal process involving a material (for example, $B_2H_6$) containing a group III element impurity is performed on substrate 110 to form a p-type emitter layer 120 on the entire surface of the substrate 110.

Subsequently, phosphorous silicate glass (PSG) containing phosphor (P) or boron silicate glass (BSG) containing boron (B) produced when p-type impurity or n-type impurity is diffused into substrate 110 is removed through an etching process. In addition, although not shown, the impurity portion formed on the side surface of substrate 110 by the impurity diffusion is removed by a laser beam or by etching, to complete the emitter layer 120. The process of removing the impurity portion is called an edge isolation process. Because the front surface of the substrate 110 is an uneven surface having the plurality of jagged portions 115, the surface of the emitter layer 120, which is formed on the textured surface of substrate 110, is likewise an uneven surface having a plurality of jagged portions 115.

In this exemplary embodiment, the emitter layer 120 is formed to have a sheet resistance greater than conventional, prior art emitter layers. For example, an emitter layer in accordance with the prior art has a sheet resistance of about 50 $\Omega$/sq., whereas the emitter layer 120 in the exemplary embodiment herein has a sheet resistance of about 80 $\Omega$/sq. to 150 $\Omega$/sq.

Because the sheet resistance of emitter layer 120 is greater than the emitter layer of the prior art, the thickness of the emitter layer 120 is thinner, as such, the impurity doped concentration of the emitter layer 120 is less as compared to the prior art. For example, a prior art emitter layer with a sheet resistance of about 50 $\Omega$/sq, has a thickness of about 300 nm to 400 m, but the emitter layer 120 of this exemplary embodiment has a thickness of about 250 nm to 350 nm.

The thickness of the emitter layer 120 can be varied by adjusting the temperature time of the thermal process. Therefore, the time required to perform the step of forming a relatively thin emitter layer 120 may be reduced. For example, using a temperate of about 840° C., forming an emitter layer with a sheet resistance of about 50 $\Omega$/sq. requires about 40 to 50. However, forming the emitter layer with a sheet resistance of about 80 to 150 $\Omega$/sq. requires about 10 to 20 minutes.

In forming the emitter layer 120 having the sheet resistance of about 80 to 150 $\Omega$/sq. by impurity diffusion, the distance the impurity moves from the impurity source to the uneven surface of the substrate 110, the amount of the impurity, and the diffusion direction of the impurity are not regular. That is, the distance, amount, and the diffusion direction of the impurity vary in accordance with the location along the surface of the substrate 110. Therefore, the thickness and the impurity concentration of the emitter layer 120 varies depending on the position in the emitter layer 120.

More specifically, the distance traveled by the impurity is less and the amount of the impurity reaching the surface of the substrate is more towards the apex, or peak of each jagged portion 115. In addition, because the disturbance of the impurity movement due to adjacent jagged portions 115 is less in the proximity of the apex or peak of each jagged portion 115, the amount of the impurity reaching the apex of each jagged portion 115 is greater than along other portions of the uneven surface. Accordingly, the thickness and the impurity doped concentration of the emitter layer 120 are greatest at the apex of each jagged portions 115 compared to the remaining portions along the uneven surface of the emitter layer 120. Accordingly, the sheet resistance near the apex of each jagged portion 115 is less than the remaining portions along the surface of the emitter layer 120.

Next, an anti-reflection layer 130 is formed on a portion of the emitter layer 120 or the front surface of substrate 110 using, for example, a plasma enhanced chemical vapor deposition (PECVD). Because the surface of the emitter layer 120 which is formed on the front surface of substrate 110 is an uneven surface, the anti-reflection layer 130 also has an uneven surface. The anti-reflection layer 130 may have a thickness of about 80 nm to 100 nm.

Figure 4D:
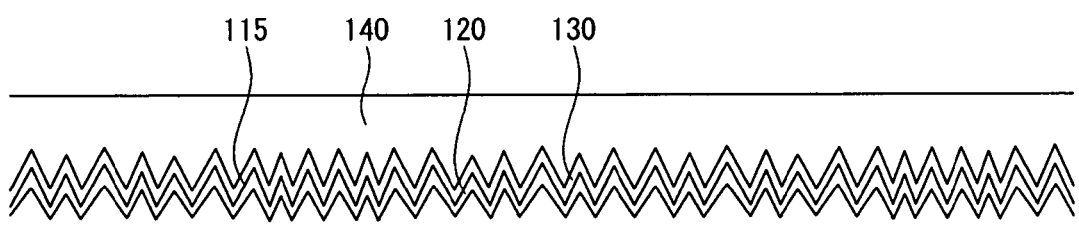
Figure 4D:
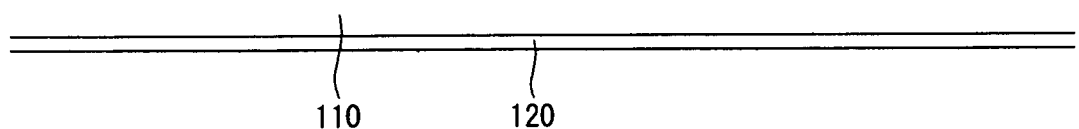

Next in sequence, as shown in FIG. 4D, a front electrode paste containing Ag is applied to corresponding portions of the anti-reflection layer 130 using, for example, a screen printing method. The paste then is dried at about 120° C. to 200° C. to form a front electrode pattern 140. The diameter of the Ag particles P2 contained in the electrode paste 140 are about 2 μm to 5 μm. As described, the distance between adjacent jagged portions 115 is about 200 nm to 500 nm, therefore, the diameter of the Ag particles P2 is substantially larger than the distance between adjacent jagged portions 115. Accordingly, the Ag particles P2 in the electrode paste are positioned not between adjacent jagged portions 115, but on or above the apex or peaks of the jagged portions 115.

Figure 4E:
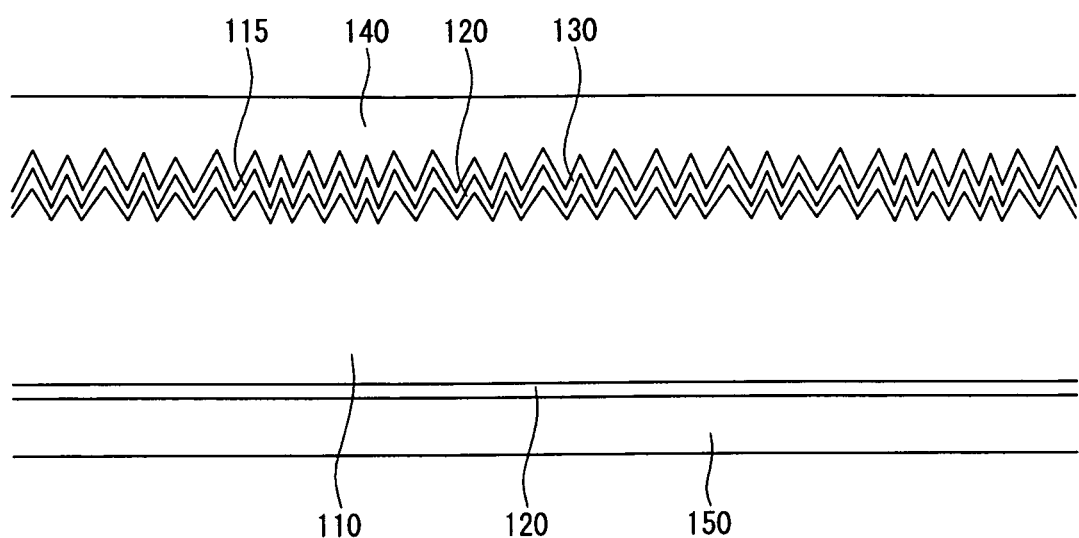

Next, as shown in FIG. 4E, a paste containing Al is applied on the rear surface of the substrate 110 using, for example, a screen printing method. the paste is then permitted to dry in order to form a rear electrode pattern 150 on the emitter layer 120 formed on the rear surface of the substrate 110. The rear electrode pattern 150 may be formed before or after forming the front electrode pattern 140.

A firing process is then performed on substrate 110 at a temperature of about 750° C. to 800° C., to form a plurality of front electrodes 141 which are electrically connected to the emitter layer 120, to form a rear electrode 151 electrically connected to the substrate 110, and to form a BSF 170 between the substrate 110 and the rear electrode 151. As a result, the solar cell 1 shown in FIGS. 1 and 2 is completed.

During the aforementioned thermal process, glass fits contained in the front electrode pattern 140, and lead Pb melt. Additionally, portions of the anti-reflection layer 130, with which the melted glass frits is in contact, are removed and the Ag particles P2 contained in the front electrode pattern 140 dissolve in the melted glass frits. The dissolved Ag particles P2 flow along with the melted glass fits and pass through the openings formed by the partial removal of the anti-reflection layer 130, so as to come in contact with the emitter layer 120. Silicon Si contained in the emitter layer 120 and the Ag particles P2 react with each other near the surface of the emitter layer 120 which results in the recrystallization of Ag. Accordingly, a plurality of recrystallized Ag particles P1 are produced in the area where the emitter layer 120 and the melted glass frits meet. Consequently, the conductive material contained in the front electrode pattern 140 are electrically connected to the emitter layer 120 through the recrystallized Ag particles P1, thus forming the plurality of front electrodes 141 which are electrically connected to the emitter layer 120.

The recrystallized Ag particles P1 have a diameter of about 300 nm to 700 nm which is also larger than the peak-to-peak distance (about 200 nm to 500 nm) between adjacent jagged portions 115. At the interface of the emitter layer 120 and the front electrodes 151, the recrystallized Ag particles P1 are now positioned on or above the apex of the jagged portions 115. The Ag particles P2 are then positioned on the recrystallization portion which includes the plurality of recrystallizated Ag particles P1, to maintain the electrical connection with the emitter layer 120 and the recrystallized Ag particles P1.

As described above, because the apex portion of each of the jagged portions 115 has a larger sheet resistance and less doped concentration than the other portions along the jagged portions 115, the apex or peak portion has a contact resistance less than the other portions. Accordingly, when the front electrodes 141 are in contact with the apex or peak portions, as compared to the other portions along the jagged portions 115, the contact force increases to improve the charge transfer efficiency between the emitter layer 120 and the front electrodes 141.

If the Ag particles P2 have a diameter more than about 5 μm, the amount of Ag particles P2 dissolved in the melted glass fits decreases. The amount of Ag particles P2 flowing toward the emitter layer 120 decreases. Still further, the amount of Ag particles P2 available for the initial reaction with silicon Si in the emitter layer 120 also decreases. As a result, the recrystallized Ag particles P1 may have a diameter less than about 300 nm, which is less than the peak-to-peak distance between adjacent jagged portions 115. Because the contact force between the front electrodes 141 and the emitter layer 120 decreases here, the charge transfer efficiency between the front electrodes 141 and the emitter layer 120 would be undesirably reduced.

On the contrary, when the Ag particles P2 have a diameter less than about 2 μm, the amount of Ag particles P2 dissolved into the melted glass frits is to much, and thereby an amount of Ag particles P2 flowing toward the emitter layer 120 increases. Thus, the amount of Ag particles P2 for the initial reaction with silicon Si in the emitter layer 120 significantly increases, such that the recrystallized Ag particles P1 would have a diameter larger than about 700 nm. Accordingly, the level of contact between jagged portions 115, and the front electrodes 141 is substantially reduced, thereby the charge transfer efficiency between the front electrodes 141 and the emitter layer 120 is undesirably reduced.

Further, according to exemplary embodiments of the present invention, because the diameter of the recrystallized Ag particles P2 is larger than the peak-to-peak distance between adjacent jagged portions 115, the electrical connection of the front electrodes 141 and the substrate 110 resulting from Ag particles P2 passed through the emitter layer 120 to recrystallize in the substrate 110 is prevented. Because damage to the emitter layer 120 is prevented in forming the front electrodes 141, it is possible to decrease the thickness and the doped impurity concentration, thereby the mobility of the charges increases and the recombination of the charges decreases. Accordingly, the charge transfer efficiency between the emitter layer 120 and the front electrodes 141 increases, to improve the operation efficiency of the solar cell 1. Moreover, the manufacturing time of the emitter layer 120 decreases thereby increasing the productivity of the solar cell 1.

In addition, during the thermal process, Al contained in the rear electrode 151 is diffused into the substrate 110 as well as the emitter layer 120 formed on the rear surface of the substrate 110 to form an impurity layer doped with an impurity of the same conductive type as the substrate 110, for example, a p-type impurity. Thus, the rear electrode pattern 150 is electrically connected to the substrate 110 through the impurity layer to form the rear electrode 151, wherein the impurity layer becomes the BSF 170. The impurity doped concentration of the BSF 170 is larger than the impurity doped concentration of the substrate 110, thus the BSF 170 is a p+ type area. Moreover, in performing the thermal process, metal components contained in the patterns 140 and 150 are chemically coupled to the contacted layers 120 and 110, respectively, such that contact resistance is reduced to improve a current flow.

According to exemplary embodiments of the present invention, the thickness and the impurity doped concentration of the emitter layer 120 decreases. Therefore, the efficiency and the productivity of the solar cell 1 are improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A solar cell comprising:
   a substrate containing impurities of a first conductive type, the substrate having a textured surface including a plurality of jagged portions;
   an emitter layer covering the textured surface, the emitter layer containing impurities of a second conductive type, wherein the conductivity of the second type is opposite the conductivity of the first conductive type, and wherein the emitter layer has a textured surface, over the textured surface of the substrate, including a plurality of jagged portions that generally align with the plurality of jagged portions of the substrate;
   a first electrode electrically connected to the emitter layer;
   a second electrode electrically connected to the substrate, wherein a concentration of the impurities of the second conductive type within the emitter layer is greatest in a proximity to a peak of each jagged portion, such that a sheet resistance near the peak of each jagged portion is less than that of a remaining portion of each jagged portion,
   wherein the first electrode comprises a plurality of first metal particles and a plurality of second metal particles, and each of the plurality of first metal particles is a recrystallized particle of second metal particles,
   wherein a diameter of all the plurality of first metal particles is greater than a peak-to-peak distance between adjacent jagged portions of the emitter layer,
   wherein a diameter of all the plurality of second metal particles is greater than the diameter of each of the plurality of first metal particles,
   wherein first metal particles, and not second metal particles, are in contact with the plurality of jagged portions of the emitter layer,
   wherein the diameter of each of the plurality of second metal particles is about 2 µm to about 5 µm.

2. The solar cell of claim 1, wherein the concentration of the impurities of the second conductive type varies within the emitter layer.

3. The solar cell of claim 2, wherein a thickness of the emitter layer is proportional to the concentration of the impurities of the second conductive type.

4. The solar cell of claim 1, wherein a thickness of the emitter layer varies.

5. The solar cell of claim 4, wherein the thickness of the emitter layer is greatest in the proximity of the peak of each jagged portion.

6. The solar cell of claim 4, wherein the thicknesses of the emitter layer varies from about 250 nm to 350 nm.

7. The solar cell of claim 6, wherein the emitter layer has a sheet resistance of about 80 Ω/sq. to 15 Ω/sq.

8. The solar cell of claim 1, wherein the plurality of first metal particles and the plurality of second metal particles are Ag particles.

9. The solar cell of claim 1, wherein the diameter of each of the plurality of first metal particles is about 300 nm to 700 nm.

10. The solar cell of claim 1, wherein the distance between adjacent jagged portions is about 200 nm to 500 nm.

11. The solar cell of claim 1, wherein the plurality of first metal particles are arranged on the plurality of jagged portions of the emitter layer, and the plurality of second metal particles are arranged on the plurality of first metal particles.

12. The solar cell of claim 1, wherein the first electrode comprises at least one material selected from nickel (Ni), copper (Cu), aluminum (Al), tin (Sn), zinc (Zn), indium (In), titanium (Ti), gold (Au), and a combination thereof.

* * * * *